(12) United States Patent
D'Abreu et al.

(10) Patent No.: US 9,141,534 B2
(45) Date of Patent: Sep. 22, 2015

(54) TRACKING READ ACCESSES TO REGIONS OF NON-VOLATILE MEMORY

(71) Applicant: SANDISK TECHNOLOGIES INC., Plano, TX (US)

(72) Inventors: Manuel Antonio D'Abreu, El Dorado Hills, CA (US); Stephen Skala, Fremont, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 318 days.

(21) Appl. No.: 13/756,946

(22) Filed: Feb. 1, 2013

(65) Prior Publication Data

US 2014/0173180 A1    Jun. 19, 2014

Related U.S. Application Data

(60) Provisional application No. 61/737,668, filed on Dec. 14, 2012.

(51) Int. Cl.
*G06F 12/02* (2006.01)
*G11C 16/34* (2006.01)

(52) U.S. Cl.
CPC ........ *G06F 12/0246* (2013.01); *G11C 16/3431* (2013.01)

(58) Field of Classification Search
CPC .................. G11C 16/3431; G06F 12/0246
USPC ...................................... 365/185.33; 711/103
See application file for complete search history.

(56) References Cited

U.S. PATENT DOCUMENTS

| 7,653,778 | B2 * | 1/2010 | Merry et al. .................. 711/103 |
| 8,078,923 | B2 | 12/2011 | Nagadomi et al. |
| 2008/0181018 | A1 | 7/2008 | Nagadomi et al. |
| 2008/0259708 | A1 | 10/2008 | Tsukazaki et al. |
| 2009/0198879 | A1 | 8/2009 | Tanaka |
| 2011/0038203 | A1 | 2/2011 | Camp et al. |
| 2012/0042118 | A1 | 2/2012 | Chou et al. |
| 2012/0278533 | A1 | 11/2012 | Suzuki et al. |
| 2013/0138871 | A1 * | 5/2013 | Chiu et al. .................... 711/103 |

OTHER PUBLICATIONS

International Search Report and Written Opinion of the International Searching Authority (EPO) for International Application No. PCT/US2013/071280, mailed Mar. 25, 2014, 11 pages.

* cited by examiner

*Primary Examiner* — Hoai V Ho
*Assistant Examiner* — Tri Hoang
(74) *Attorney, Agent, or Firm* — Toler Law Group, PC (57) ABSTRACT

A data storage device includes a memory and a controller and may perform a method that includes updating, in the controller, a value of a particular counter of a set of counters in response to a read access to a particular region of the non-volatile memory that is tracked by the particular counter. Read accesses to a first region of the non-volatile memory are tracked by a first counter of the set of counters and read accesses to a second region of the non-volatile memory are tracked by a second counter of the set of counters. The method includes, in response to the value of the particular counter indicating that a count of read accesses to the particular region equals or exceeds a first threshold, initiating a remedial action to the particular region of the non-volatile memory.

16 Claims, 4 Drawing Sheets

TRACKING READ ACCESSES TO REGIONS OF NON-VOLATILE MEMORY

CROSS-REFERENCE TO RELATED APPLICATIONS

The present application claims priority to U.S. Provisional Application No. 61/737,668, filed Dec. 14, 2012, which application is hereby incorporated by reference in its entirety.

FIELD OF THE DISCLOSURE

The present disclosure is generally related to tracking accesses to non-volatile memory.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. As more parity bits are used, an error correction capacity of the ECC increases and a number of bits required to store the encoded data also increases.

One source of errors that occur in data stored in a memory device is a result of read accesses to the memory device. When voltages are applied to a word line and to bit lines of a flash memory device to enable reading of stored data at the word line, threshold voltages of neighboring word lines may be disturbed (e.g., slightly increased) due to inter-cell coupling within the memory device. Read disturb effects are cumulative and, if not remedied, may result in a number of errors in stored data exceeding an ECC error correction capacity of a data storage device.

SUMMARY

Read accesses to regions of a non-volatile memory of a data storage device are tracked by a set of counters. When a counter value indicates that a number of read accesses to a particular region tracked by the counter exceeds a threshold amount, a remedial action, such as a data refresh operation or a data move operation, is initiated to data stored in the particular region. As a result, read disturb effects to data stored in the memory may be corrected via refreshing or moving the data prior to accumulated read disturb effects exceeding a correction capability of the data storage device. Logical partitioning of the non-volatile memory into regions for read access tracking may be programmable and may be adaptively determined based on various factors to accommodate varying sensitivity to read disturb effects within the non-volatile memory.

DETAILED DESCRIPTION

Figure 1:
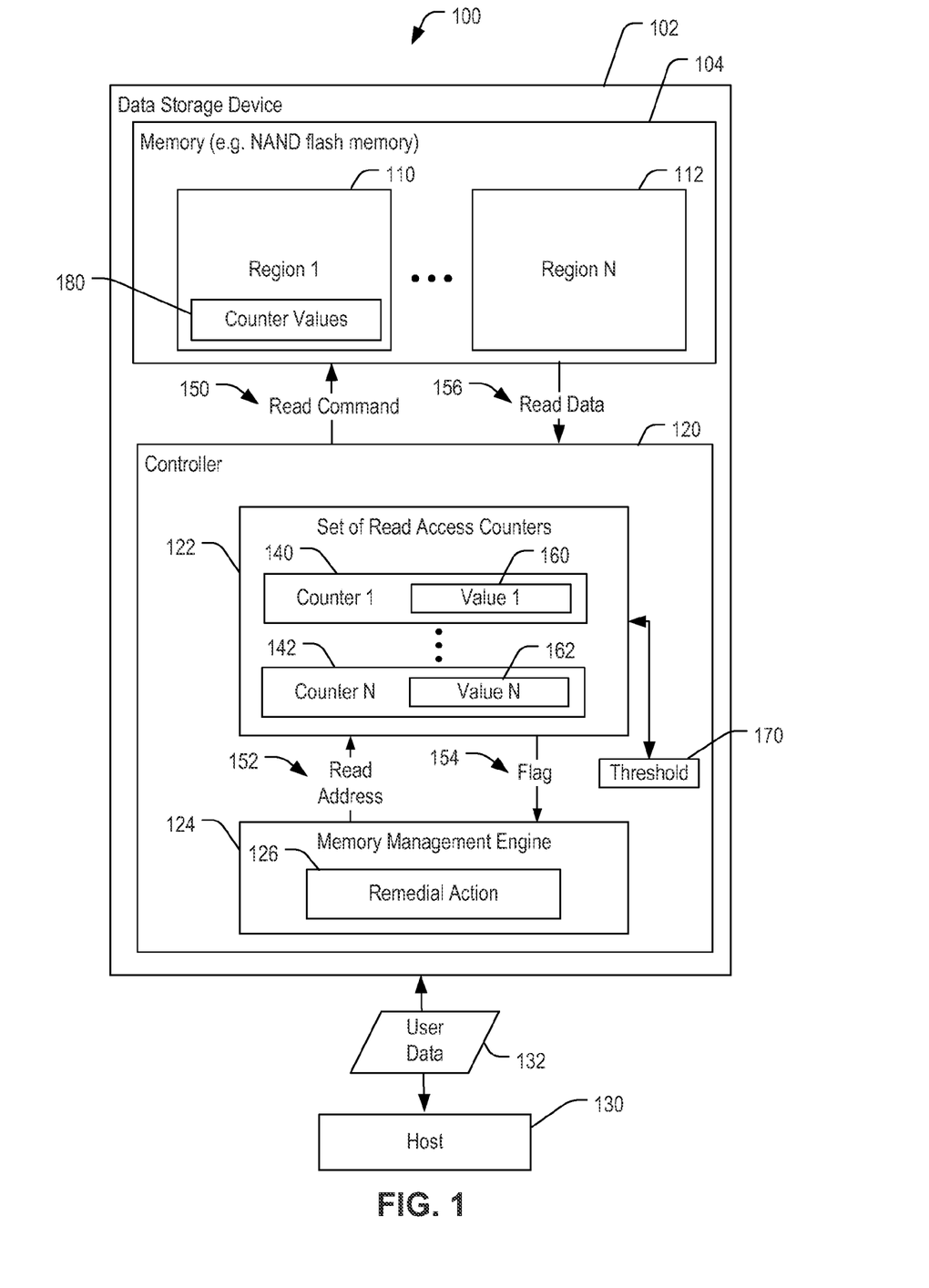
FIG. 1 is a block diagram of a particular illustrative embodiment of a system including a data storage device configured to track read accesses to multiple regions of memory and to initiate a remedial action.

Referring to FIG. 1, a particular embodiment of a system 100 includes a data storage device 102 coupled to a host device 130. The data storage device 102 is configured to track read accesses to multiple regions of a non-volatile memory 104 and to initiate a remedial action based on the tracked read accesses.

The host device 130 may be configured to provide data, such as user data 132, to be stored at the non-volatile memory 104 or to request data to be read from the memory 104. For example, the host device 130 may include a mobile telephone, a music or video player, a gaming console, an electronic book reader, a personal digital assistant (PDA), a computer, such as a laptop computer, a notebook computer, or a tablet, solid state storage drive, any other electronic device, or any combination thereof.

The data storage device 102 includes the non-volatile memory 104 coupled to a controller 120. The non-volatile memory 104 may be a flash memory, such as a NAND flash memory. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples.

The non-volatile memory 104 includes multiple groups of storage elements, such as word lines of a multi-level cell (MLC) flash memory that include multiple MLC flash cells. The non-volatile memory 104 may also include multiple blocks of storage elements, such as erase blocks of a flash memory that include multiple word lines in each erase block. The non-volatile memory 104 is logically partitioned into multiple regions including a first region (region 1) 110 and an Nth region (region N) 112, where N is an integer greater than one. Each region 110-112 can include one or more word lines, blocks, or other portions of the non-volatile memory 104. To illustrate, in an implementation where the non-volatile memory 104 includes multiple arrays, multiple planes, multiple dies, or any combination thereof, each region 110-112 may include multiple word lines or blocks within a single array, plane, or die. As another example, a single region (e.g., the first region 110) may span multiple arrays, planes, or dies, or any combination thereof. To illustrate, the first region 110 may include storage elements within a first die and storage elements within a second die.

The controller 120 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data and a write command to instruct the non-volatile memory 104 to store the data to a specified address. As another example, the controller 120 is configured to send a read command to read data from a specified address of the non-volatile memory 104.

The controller 120 may include an ECC engine (not shown) that is configured to receive data to be stored to the non-volatile memory 104 and to generate a codeword. For example, the ECC engine may include an encoder configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode data according to one or more other ECC encoding schemes, or any combination thereof. The ECC engine may include a decoder configured to decode data read from the non-volatile memory 104 to detect and correct, up to an error correction capability of the ECC scheme, bit errors that may be present in the data.

The controller 120 includes a set of counters 122 that are configured to track read accesses performed to the regions 110-112 of the non-volatile memory 104. The set of counters 122 includes multiple counters, including a first counter (counter 1) 140 and an Nth counter (counter N) 142. The first counter 140 has a first counter value (value 1) 160 that is updatable by the controller 120 to track memory accesses to the first region 110. The Nth counter 142 has an Nth value 162 that is also updatable by the controller 120 to track memory accesses to the Nth region 112.

The controller 120 includes a memory management engine 124. The memory management engine 124 is configured to receive read requests from the host device 130 and to determine a read address 152 corresponding to the requested data. For example, the read address 152 may correspond to a physical address of one or more wordlines in the non-volatile memory 104. To illustrate, the memory management engine 124 may receive a logical address of requested data stored in the non-volatile memory 104 and may perform an address translation to generate a physical read address, such as the read address 152. The memory management engine 124 is configured to generate a read command 150 to read data from the read address 152 of the non-volatile memory 104. In addition, the memory management engine 124 is configured to provide the read address 152 to the set of read access counters 122.

In response to determining the read address 152 corresponding to a physical address of data to be read from the non-volatile memory 104, the controller 120 may select a particular counter of the set of counters 122 corresponding to a region of the non-volatile memory 104 that is tracked by the particular counter. For example, when the read address 152 corresponds to data in the first region 110, the controller 120 may determine that the first counter 140 maintains a count of read accesses to the first region 110, and as a result the first value 160 may be updated by the first counter 140. As another example, when the read address 152 corresponds to an address in the Nth region 112, which is tracked by the Nth counter 142, the Nth value 162 of the Nth counter 142 may be updated to indicate the read operation.

Each of the values 160-162 that correspond to counts of read accesses to the particular regions tracked by the corresponding counters 140-142 are compared to a threshold 170. In response to determining that one or more of the values 160-162 equals or exceeds the threshold 170, a flag 154 may be generated and provided to the memory management engine 124. The memory management engine 124 may receive the flag 154 and may initiate a remedial action 126 to the corresponding region of the non-volatile memory 104.

For example, when the first value 160 indicates that a count of read accesses to the first region 110 equals or exceeds the threshold 170, the controller 120 may be configured to initiate the remedial action 126 to the first region 110. The remedial action 126 may include a data move operation that causes data in the corresponding region 110 to be moved to a different memory location of the non-volatile memory 104. As another example, the remedial action 126 may include a data refresh operation. The data refresh operation may include copying data from each block of the region 110, erasing the particular block, and re-writing the data to the erased block. By moving data to another block, or by refreshing the data in a block, a shifting of states of storage elements as a result of read disturb effects may be remedied, and the storage elements within the block or groups of blocks may be returned to an originally programmed state. Potential corruption of data in the non-volatile memory 104 caused by read disturb effects may be anticipated based on counts of read accesses to each of the regions 110-112 and the remedial action 126 may be performed to avoid unrecoverable corruption of data resulting from accumulated read disturb effects resulting from multiple read accesses.

In some implementations, the counters 140-142 may count upward from a reset value (e.g., a 0 value) with each read access to the region tracked by the particular counter 140-142. The value 160-162 of each counter 140-142 may be compared against the threshold 170 (e.g., each time the value 160-162 is updated) to determine when a number of read accesses to a corresponding region 110-112 of the non-volatile memory 104 meets or exceeds the threshold 170. However, in other implementations, other configurations of the counters 140-142 may be applied. For example, the counters 140-142 may be initially set to a value corresponding to a read access limit, and the counters 140-142 may decrement the corresponding value 160-162 with each read access. When one of the values 160-162 reaches a zero value, the flag 154 may be provided to the memory management engine 124.

The controller 120 may be configured to store counter values 180 to specific or dedicated portions of the non-volatile memory 104 for storage during power off conditions. For example, the controller 120 may be configured to store counter values 180 of the set of counters 122 to the non-volatile memory 104 during a session shutdown operation of the data storage device 102. The controller 120 may further be configured to retrieve the stored counter values 180 from the non-volatile memory 104 and to initialize the counters 140-142 of the set of counters 122 according to the stored counter values 180 during a session initialization operation of the data storage device 102. To illustrate, the counter values 180 may include a table or other data structure that indicates a number of the regions 110-112 (e.g., N regions), and for each region, may include a value of a corresponding counter (e.g., the first value 160 for the first region 110, an address range corresponding to the particular region (e.g., addresses of a first and last erase block within the first region 110), and a value of the threshold 170 corresponding to the particular region. For example, as described in further detail with respect to FIG. 3, a number and arrangement of the regions 110-112 may be modified over the life of the data storage device 102. In addition, as the data storage device 102 ages, values of the threshold 170 may be modified from an initial value, and different regions 110-112 may correspond to different thresholds.

During operation, the host device 130 may request the user data 132 to be read from the non-volatile memory 104. The memory management engine 124 may translate an address of the requested user data 132 and may provide the read address 152 to the set of read access counters 122. In addition, the controller 120 may issue the read command 150 to the non-volatile memory 104, such as concurrently with providing the read address 152 to the set of read counters 122.

The controller 120 may determine a particular counter of the set of counters 122 that tracks the region of the non-volatile memory 104 corresponding to the read address 152. For example, the read address 152 may correspond to a wordline in the first region 110, which may be tracked by the first counter 140. In response to receiving the read address 152, a determination may be made that the read address 152 corresponds to the first counter 140, and the first counter 140 may update the first value 160 to indicate an additional read access has been or is being performed within the first region 110.

In response to the read command 150 being sent to the non-volatile memory 104, requested data may be provided from the non-volatile memory 104 to the controller 120 as read data 156. The controller 120 may process the read data 156, such as by decoding the read data 156 and correcting one or more read errors that may occur in the read data 156, and may provide the resulting user data 132 to the host device 130.

In addition, in response to the first value 160 (upon being updated by the first counter 140) equaling or exceeding the threshold 170, a corresponding flag 154 may be provided to the memory management engine 124. In response to receiving the flag 154, the memory management engine 124 may initiate the remedial action 126, such as by providing memory addresses or block indicators to a move queue or a refresh queue for scheduling a data move operation or a data refresh operation, such as described in further detail with respect to FIG. 2.

By tracking counts of read accesses to different regions of the non-volatile memory 104, and by initiating the remedial action 126 in response to a count of read accesses to a particular region 110-112 meeting or exceeding the threshold 170, cumulative effects of read disturbs occurring in the particular region 110-112 may be remedied. As a result, a number of errors occurring in the read data 156 due to read disturbs may be maintained at a reduced level as compared to systems that do not track and remedy accumulated read disturb effects. The set of counters 122 and corresponding logic to map the set of counters 122 to individual regions of the non-volatile memory 104 may be implemented in dedicated circuitry to reduce latency and processing impact on the controller 120 during the read access operation, as described in further detail with respect to FIG. 2. Alternatively, the set of read access counters 122 may be implemented via one or more software processes executed by a processor within the controller 120, or by a combination of software executed by a processor and dedicated circuitry.

Figure 2:
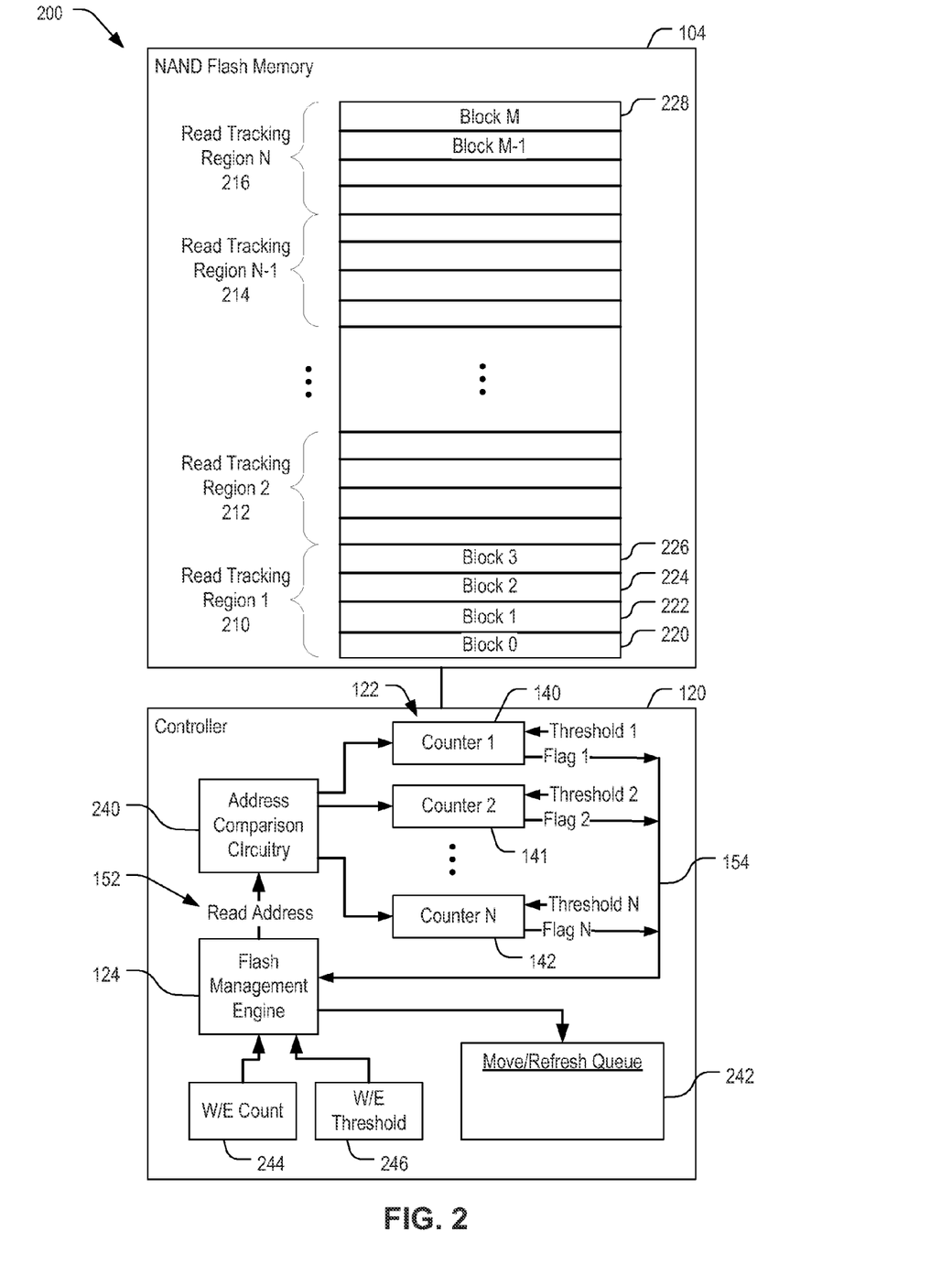
FIG. 2 is a block diagram illustrating a particular embodiment of components that may be incorporated in the data storage device of FIG. 1.

Referring to FIG. 2, a particular embodiment of the data storage device 102 of FIG. 1 is illustrated and generally designated 200. The non-volatile memory 104 is illustrated as a NAND flash memory that includes multiple erase blocks, including block 0 220, block 1 222, block 2 224, block 3 226, and additional blocks up to an Mth block (block M) 228. The NAND flash memory 104 is logically partitioned into multiple read tracking regions, illustrated as a first read tracking region 210, a second read tracking region 212, and additional regions up to an N–1st read tracking region 214 and an Nth read tracking region 216. The controller 120 includes the set of counters 122 including the first counter 140, a second counter 141, and one or more other counters including the Nth counter 142. The controller 120 includes address comparison circuitry 240 that is coupled to receive the read address 152 from the flash management engine 124 and to generate an output signal to a counter that tracks a region 210-216 of the NAND flash memory 104 corresponding to the read address 152. The controller 120 further includes a count of write/erase cycles 244, a write/erase threshold 246, and a move/refresh queue 242.

The controller 120 is configured to provide the read address 152 from the flash management engine 124 to the address comparison circuitry 240. The address comparison circuitry 240 may be programmable to route particular read addresses 152 to particular counters of the set of counters 122. For example, the address comparison circuitry 240 may determine whether the read address 152 is within a first address range corresponding to the first read tracking region 210, a second address range corresponding to the second read tracking region 212, etc., and may generate an output signal to a corresponding one of the counters 140-142 to cause the counter to update its counter value.

Each of the counters 140-142 may be responsive to a corresponding threshold, illustrated as threshold 1, threshold 2, . . . threshold N. For example, each counter 140-142 may be configured to perform comparisons of the counter's value to its corresponding threshold and to generate a flag signal in response to the value meeting or exceeding the threshold. To illustrate, when the first counter 140 updates its counter value to an amount that matches the first threshold (threshold 1), the first counter 140 may generate a first flag indication (Flag 1) that may be provided to the flash management engine 124 as the flag 154. Each of the counters 140-142 may have a programmable threshold value such that each of the thresholds may have a distinct value, or one or more (or all) of the counters 140-142 may use a same threshold value.

Each of the counters 140-142 may provide a distinct flag signal to the flash management engine 124. For example, the flag indicator 154 may be a multi-bit signal, such as an interrupt signal with each bit of the interrupt signal corresponding to a distinct counter of the set of counters 122. In this manner, the flash management engine 124 may determine a particular read tracking region 210-216 that has a count of read accesses matching or exceeding its corresponding threshold. In response, the flash management engine 124 may perform the remedial action 126 of FIG. 1 by adding addresses of the blocks of the corresponding region, such as block 0-3 220-226 of the first read tracking region 210, to the move/refresh queue 242.

The flash management engine 124 may be configured to perform data move operations to transfer data from addresses indicated in the move/refresh queue 242 to other addresses in the NAND flash memory 104. Alternatively, the flash management engine 124 may be configured to perform refresh operations of blocks indicated in the move/refresh queue 242. For example, the flash management engine 124 may perform data moves or data refreshes as part of housekeeping operations at the controller 120, such as in a background process.

The flash management engine 124 may be configured to keep track of a write/erase count 244 of write and erase cycles performed at the NAND flash memory 104. For example, the flash management engine 124 may determine an "age" of the NAND flash memory 104 based on the write/erase count 244. Because an ability of the NAND flash memory 104 to maintain distinct states of storage elements may degrade, as the write/erase count 244 increases, the counter thresholds may be reduced as the device 200 ages (e.g., as the write/erase count 244 increases).

The flash management engine 124 may be configured to compare the write/erase count 244 to the write/erase threshold 246, and upon determining that the write/erase count 244 meets or exceeds the write/erase threshold 246, to perform one or more updates of the read tracking mechanism. For example, the flash management engine 124 may be configured to update logical partitioning of the NAND flash memory 104 into a greater number of read tracking regions 210-216, as described in further detail with respect to FIG. 3. As another example, the flash management engine 124 may decrease the thresholds for each of the counters 140-142 so that remedial actions are taken more frequently for older memories than for fresh memories that have a greater capacity to maintain distinct states of memory cells in the NAND flash memory 104.

Figure 3:
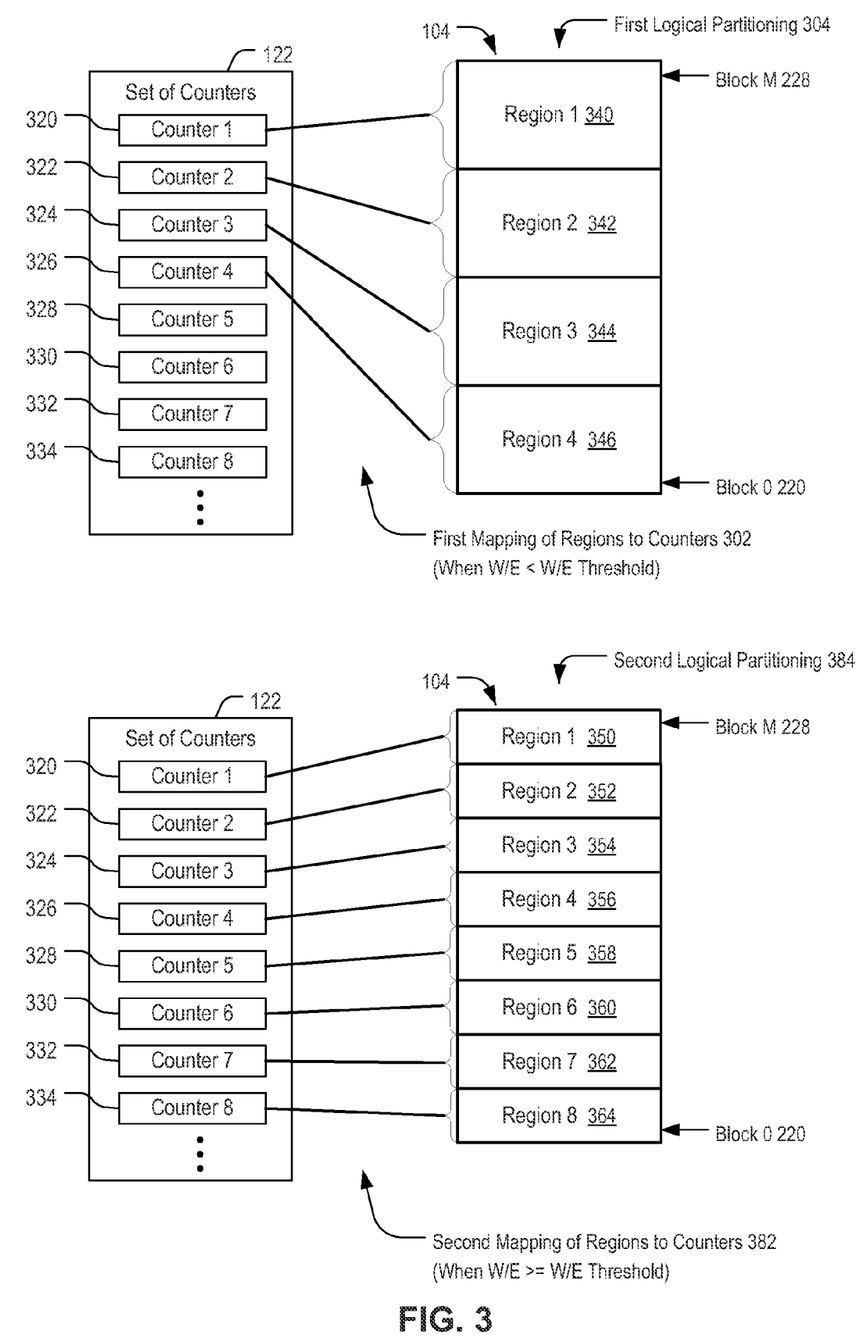
FIG. 3 is a general diagram that illustrates logical partitioning of the memory of FIG. 1 and mappings of counters to regions of the memory.

Referring to FIG. 3, a first logical partitioning 304 and a first mapping of regions to counters 302 and a second logical partitioning 384 and a second mapping of regions to counters 382 are illustrated. The first logical partitioning 304 may correspond to a partitioning of the non-volatile memory 104 into four regions including a first region 340, a second region 342, a third region 344, and a fourth region 346. The four regions 340-346 may span the entire non-volatile memory 104, from a lowest indexed block (block 0 220) to a highest indexed block (block M 228).

The set of counters 122 is illustrated as including a first counter 320, a second counter 322, a third counter 324, a fourth counter 326, a fifth counter 328, a sixth counter 330, a seventh counter 332, and an eighth counter 334, and may include one or more additional counters (not shown). According to the first mapping of regions to counters 302, the first counter 320 is mapped to the first region 340, the second counter 322 is mapped to the second region 342, the third counter 324 is mapped to the third region 344, and the fourth counter 326 is mapped to the fourth region 346. The remaining counters 328-334 are not mapped to any of the memory regions 344-346 and may be unused.

The first mapping of regions to counters 302 and the first logical partitioning 304 may be applied by the controller 120 of FIGS. 1-2 in response to the write/erase count 244 of FIG. 2 being less than the write/erase threshold 246. For example, the first mapping of regions to counters 302 and the first logical partitioning 304 may be an initial configuration of the memory device 102 of FIG. 1 and may be set according to an initial set of programmable values, such as determined by a manufacturer of the data storage device 102.

With operation of the data storage device 102, the write/erase count 244 may eventually equal or surpass the write/erase threshold 246. In response to the write/erase count 244 equaling or exceeding the write/erase threshold 246, or in response to some other triggering event, the controller 120 of FIG. 1 may be configured to modify the logical partitioning of the non-volatile memory 104 from the first logical partitioning 304 including the first set of regions 340-346 to the second logical partitioning 384 that includes a second set of regions. The second set of regions includes a first region 350, a second region 352, a third region 354, a fourth region 356, a fifth region 358, a sixth region 360, a seventh region 362, and an eighth region 364. The number of regions in the second set of regions 350-364 (e.g., 8) is greater than the first number of regions in the first set of regions 340-346 (e.g., 4).

The controller 120 may also be configured to update a mapping of regions from the first mapping of regions to counters 302 to the second mapping of regions to counters 382. The second mapping of regions to counters 382 enables tracking of each region of the second set of multiple regions 350-364 with a respective counter 320-334 of the set of counters 122. As illustrated, the second logical partitioning 384 may be formed by subdividing each of the regions of the first logical partitioning 304 into two regions, to increase the number of regions from four (according to the first logical partitioning 304) to eight (corresponding to the second logical partitioning 384).

The controller 120 may further be configured to update the second logical partitioning 384 and the second mapping of regions to counters 382 to generate a third or further set of logical partitionings and mappings of regions to counters according to one or more other triggering events or other criteria. For example, when the erase/write count 244 of FIG. 2 exceeds a second erase/write threshold, the logical partitioning 384 may be increased to a larger number of regions, such as sixteen regions, and additional counters of the set of counters 122 may be assigned to accommodate tracking of memory read accesses to the newly established number of regions (e.g., sixteen counters may be mapped to the sixteen regions).

Although the first and second logical partitionings 304 and 384 illustrate multiple regions having substantially equal size and that are substantially evenly distributed throughout the non-volatile memory 104, it should be understood that in other implementations one or more of the memory regions may have a size differing from others of the memory regions. For example, a higher number of reads may be expected in a region that stores data having a high read access rate, such as a boot partition or area of the non-volatile memory 104 that stores other file management information. In this case, a smaller region may be used for portions of the non-volatile memory 104 expected to have higher read access rates, while larger regions may be used for portions of the non-volatile memory 104 expected to have lower read access rates. As another example, effects of read disturb on stored data in the non-volatile memory 104 may be dependent on one or more other factors, such as a location in a memory array (e.g., at an edge of the array as compared to at an interior of the array), a particular plane of multi-plane memory, a particular die of a multi-die memory, one or more other factors such as a type of data stored, a ratio of '0' values to '1' values in stored data at the non-volatile memory 104, or other factors.

Because partitioning of the non-volatile memory 104 into multiple regions and the mapping of regions to counters may be programmable, the data storage device 102 may be configured to accommodate various factors and various differences in read access rates and effects of read disturb on various portions of the non-volatile memory 104. For example, the first logical partitioning 304 and the first mapping of regions to counters 302 may be set by a manufacturer of the data storage device 102 of FIG. 1. To illustrate, regions of the memory 104 defined by the first logical partitioning 304 may be set based on results of testing portions of the non-volatile memory 104 for susceptibility to read disturb effects, based on types of data stored to regions of the non-volatile memory 104, such as file management data or pre-loaded content, based on one or more other criteria, or any combination thereof.

The memory management engine 124 may be configured to update the first logical partitioning 304 and the first mapping of regions to counters 302 according to one or more criteria, such as according to a history of read accesses to different portions of the non-volatile memory 104 and/or according to the write erase count 244 of FIG. 2, as non-limiting examples, to generate the second logical partitioning 384 and the second mapping of regions to counters 382. For example, the flash management engine 124 of FIG. 1 may store the counter values 160, 162 corresponding to regions of the first logical partitioning 304. The flash management engine 124 may update address ranges used by the address comparison circuitry 240 of FIG. 2 so that twice as many address ranges are used, with each of the updated address ranges including approximately half as many addresses as the prior address ranges. Counters of the set of counters 122 may be assigned to an updated address range by the address comparison circuitry 240. The assigned counters may be initialized to a counter value that is approximately half of the stored counter value corresponding to the region of the memory. For example, if the first region 110 is tracked by the first counter 140 and has a counter value 160 of two hundred, after partitioning the first region 110 into two regions, the counters assigned to each of the two regions may each be initialized to a value of one hundred.

Figure 4:
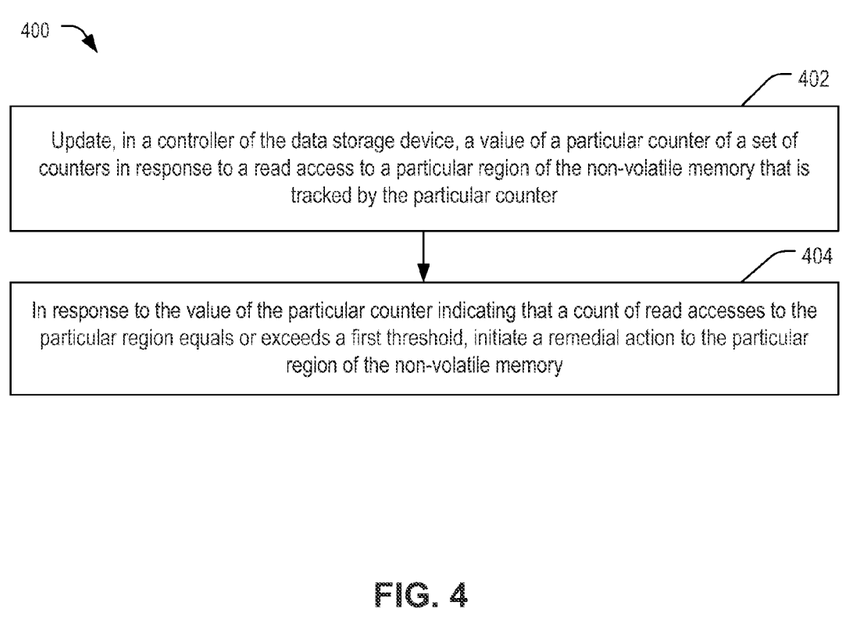
FIG. 4 is a flow chart of a particular illustrative embodiment of a method of tracking read accesses to regions of a non-volatile memory.

Referring to FIG. 4, a particular embodiment of a method 400 is depicted. The method 400 may be performed in a data storage device that includes a controller and a non-volatile memory, such as a flash memory. For example, the method 400 may be performed by the data storage device 102 of FIG. 1.

The method includes updating, in a controller of the data storage device, a value of a particular counter of a set of counters in response to a read access to a particular region of the non-volatile memory that is tracked by the particular counter, at 402. Read accesses to a first region of the non-volatile memory are tracked by a first counter of the set of counters and read accesses to a second region of the non-volatile memory are tracked by a second counter of the set of counters. For example, read accesses to the first region 110 of FIG. 1 may be tracked by the first counter 140 and read accesses to the Nth region 112 of FIG. 1 may be tracked by the Nth counter 142.

In response to the value of the particular counter indicating that a count of read accesses to the particular region equals or exceeds a first threshold, a remedial action to the particular region of the non-volatile memory is initiated, at 404. For example, the remedial action may be the remedial action 126 initiated by the memory management engine 124 of FIG. 1 and may include a data move operation or a data refresh operation. In response to completion of the remedial action to the particular region, the value of the particular counter may be reset.

The method 400 may also include, during a session shutdown operation of the data storage device, storing values of the set of counters to the non-volatile memory. During a session initialization operation of the data storage device, stored counter values may be retrieved from the non-volatile memory and counters of the set of counters may be initialized according to the stored counter values. For example, the controller 120 may store the counter values 180 of FIG. 1 to the non-volatile memory 104 upon powering down and may retrieve the counter values 180 from the non-volatile memory 104 during an initialization/powering up event.

The non-volatile memory may be logically partitioned into a first set of multiple regions and a count of read accesses to each of the multiple regions may be tracked by a respective counter of the set of counters, such as the first logical partitioning 304 of FIG. 3 that partitions the memory 104 into four regions 340-346 that are tracked by four counters 320-326. A first number of regions included in the first set of multiple regions may be programmable. For example, in response to a triggering event, the method 400 may include modifying the logical partitioning of the non-volatile memory to form a second set of multiple regions (e.g., the set of eight regions 350-364 according to the second logical partitioning 384 of FIG. 3). The triggering event may correspond to a count of erase cycles (e.g., the W/E count 244 of FIG. 2) equaling or exceeding an erase threshold (e.g., the W/E threshold 246 of FIG. 2). A second number of regions in the second set of regions may be greater than the first number of regions in the first set of regions, and a mapping of regions to counters may be updated to track each region of the second set of multiple regions with a respective counter of the set of counters. For example, the first mapping of regions to counters 302 of FIG. 3 may be updated by the memory management engine 124 of FIG. 1 by assigning a counter of the set of counters 122 to each of the regions of the second logical partitioning 384 to generate the second mapping of regions to counters 382.

Although various components depicted herein are illustrated as block components and described in general terms, such components may include one or more microprocessors, state machines, or other circuits configured to enable the controller 120 of FIG. 1 to initiate the remedial action based on comparisons of the counter values 160-162 to one or more threshold(s) 170. For example, the controller 120 may represent physical components, such as hardware controllers, state machines, logic circuits, or other structures, to enable the controller 120 of FIG. 1 to track read accesses to individual regions 110-112 and to initiate a data move operation or a data refresh operation to individual regions 110-112.

The controller 120 may be implemented using a microprocessor or microcontroller programmed to update counters in response to read accesses to corresponding regions of the memory 104, and upon determining that a counter value indicates that a number of read accesses to a particular region matches or exceeds a threshold amount, to initiate a remedial action, such as by adding blocks of the region to a refresh queue or a move queue. In a particular embodiment, the controller 120 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device that includes a controller and a non-volatile memory that is logically partitioned into a first set of multiple regions, performing:
  updating, in the controller of the data storage device, a value of a first counter of a set of counters in response to a read access to a first region of the non-volatile memory, wherein read accesses to the first region of the non-volatile memory are tracked by the first counter of the set of counters and wherein read accesses to a second region of the non-volatile memory are tracked by a second counter of the set of counters;
  in response to the value of the first counter indicating that a count of read accesses to the first region equals or exceeds a first threshold, initiating a remedial action to the first region of the non-volatile memory; and
  in response to a triggering event:
    modifying logical partitioning of the non-volatile memory to form a second set of multiple regions, wherein a first number of regions in the first set of multiple regions is less than a second number of regions in the second set of multiple regions; and
    updating a mapping of regions to counters to track each region of the second set of multiple regions with a respective counter of the set of counters.

2. The method of claim 1, wherein the remedial action includes at least one of a data move operation or a data refresh operation.

3. The method of claim 1, further comprising, in response to completion of the remedial action to the first region, resetting the value of the first counter.

4. The method of claim 1, further comprising, during a session shut-down operation of the data storage device, storing values of the set of counters to the non-volatile memory.

5. The method of claim 1, further comprising, during a session initialization operation of the data storage device, retrieving stored counter values from the non-volatile memory and initializing counters of the set of counters according to the stored counter values.

6. The method of claim 1, further comprising:
  modifying the logical partitioning of the non-volatile memory to form a third set of multiple regions, wherein a third number of regions in the third set of multiple regions is greater than the second number of regions in the second set of multiple regions; and
  updating the mapping of regions to counters to track each region of the third set of multiple regions with a respective counter of the set of counters.

7. The method of claim 1, wherein the triggering event corresponds to a count of erase cycles equaling or exceeding an erase threshold.

8. The method of claim 1, wherein the non-volatile memory includes a flash memory.

9. A data storage device comprising:
a non-volatile memory; and
a controller including a set of counters, wherein the controller is configured to update a value of a first counter of the set of counters in response to a read access to a first region of the non-volatile memory, wherein read accesses to the first region of the non-volatile memory are tracked by the first counter of the set of counters and wherein read accesses to a second region of the non-volatile memory are tracked by a second counter of the set of counters,
wherein, in response to the value of the first counter indicating that a count of read accesses to the first region equals or exceeds a first threshold, the controller is configured to initiate a remedial action to the first region of the non-volatile memory, and
wherein the controller is further configured to logically partition the non-volatile memo into a first set of multiple regions and, in response to a triggering event, to modify logical partitioning of the non-volatile memory to form a second set of multiple regions wherein a first number of regions in the first set of multiple regions is less than a second number of regions in the second set of multiple regions, and to update a mapping of regions to counters to track each region of the second set of multiple regions with a respective counter of the set of counters.

10. The data storage device of claim 9, wherein the remedial action includes at least one of a data move operation or a data refresh operation.

11. The data storage device of claim 9, wherein the controller is configured to, in response to completion of the remedial action to the first region, reset the value of the first counter.

12. The data storage device of claim 9, wherein the controller is further configured to store values of the set of counters to the non-volatile memory during a session shut-down operation of the data storage device.

13. The data storage device of claim 9, wherein the controller is further configured to retrieve stored counter values from the non-volatile memory and initialize counters of the set of counters according to the stored counter values during a session initialization operation of the data storage device.

14. The data storage device of claim 9, wherein the controller is further configured to modify the logical partitioning of the non-volatile memory to form a third set of multiple regions, wherein a third number of regions in the third set of multiple regions is greater than the second number of regions in the second set of multiple regions, and to update the mapping of regions to counters to track each region of the third set of multiple regions with a respective counter of the set of counters.

15. The data storage device of claim 9, wherein the triggering event corresponds to a count of erase cycles equaling or exceeding an erase threshold.

16. The data storage device of claim 9, wherein the non-volatile memory includes a flash memory.

* * * * *

UNITED STATES PATENT AND TRADEMARK OFFICE
CERTIFICATE OF CORRECTION

PATENT NO. : 9,141,534 B2
APPLICATION NO. : 13/756946
DATED : September 22, 2015
INVENTOR(S) : Manuel Antonio D'Abreu et al.

It is certified that error appears in the above-identified patent and that said Letters Patent is hereby corrected as shown below:

IN THE CLAIMS

Claim 9 (Column 12, Line 20) "partition the non-volatile memo into a first set of mul-" should be --partition the non-volatile memory into a first set of mul- --.

Signed and Sealed this
Twenty-second Day of March, 2016

Michelle K. Lee
*Director of the United States Patent and Trademark Office*